United States Patent
Cho

(10) Patent No.: US 7,177,659 B2
(45) Date of Patent: Feb. 13, 2007

(54) POWER AMPLIFICATION SYSTEM AND METHOD

(75) Inventor: Bag Gi Cho, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 520 days.

(21) Appl. No.: 10/681,066

(22) Filed: Oct. 7, 2003

(65) Prior Publication Data
US 2004/0077369 A1    Apr. 22, 2004

(30) Foreign Application Priority Data
Oct. 16, 2002    (KR) .................... 10-2002-0063207

(51) Int. Cl.
  H04B 7/00    (2006.01)
  H04B 1/04    (2006.01)
  H04Q 7/20    (2006.01)
  H01Q 11/12   (2006.01)

(52) U.S. Cl. .................... 455/522; 455/126; 455/127.1

(58) Field of Classification Search ................ 455/522, 455/560, 126, 127.1, 127.2, 127.4, 115.1, 455/127.5; 330/279, 127, 129; 375/295, 375/297
See application file for complete search history.

(56) References Cited

U.S. PATENT DOCUMENTS

| | | | | |
|---|---|---|---|---|
| 4,392,245 | A | | 7/1983 | Mitama |
| 5,432,473 | A | * | 7/1995 | Mattila et al. ............... 330/279 |
| 5,590,408 | A | * | 12/1996 | Weiland et al. ............... 455/69 |
| 5,606,285 | A | * | 2/1997 | Wang et al. .................. 330/279 |
| 5,732,334 | A | | 3/1998 | Miyake ........................ 455/126 |
| 5,752,172 | A | * | 5/1998 | Matero ...................... 455/127.3 |
| 5,852,770 | A | * | 12/1998 | Kasamatsu ................... 455/126 |
| 6,370,364 | B1 | * | 4/2002 | Liimatainen ................ 455/126 |
| 6,430,402 | B1 | * | 8/2002 | Agahi-Kesheh ........... 455/115.3 |
| 6,751,448 | B1 | * | 6/2004 | Frydman et al. ............. 455/126 |
| 6,819,938 | B2 | * | 11/2004 | Sahota ........................ 455/522 |
| 7,006,843 | B1 | * | 2/2006 | Eckert et al. ............... 455/522 |
| 2005/0059424 | A1 | * | 3/2005 | Sahota ........................ 455/522 |

FOREIGN PATENT DOCUMENTS

| | | |
|---|---|---|
| CN | 1146131 A | 3/1997 |
| EP | 0397444 A2 | 4/1990 |
| EP | 0 397 444 A | 11/1990 |
| EP | 0 589 228 A | 3/1994 |
| EP | 989689 A2 * | 3/2000 |
| JP | 13-017098 | 6/1935 |
| JP | 55-001542 | 1/1980 |
| JP | 07-250020 | 9/1995 |
| JP | 10-126282 | 5/1998 |

(Continued)

Primary Examiner—Aung Moe
(74) Attorney, Agent, or Firm—Lee Hong Degerman Kang & Schmadeka

(57) ABSTRACT

A system for maintaining an amplified transmission level for a mobile communication device is provided. The system includes an amplification module in communication with a signal generator of the mobile communication device; a communication module for transmitting a first signal amplified by the amplification module in form of a second signal; and a power adjusting unit in communication with the amplification module and the communication module, wherein the power adjusting unit measures first and second power levels respectively associated with the first and second signals to determine first and second difference values.

31 Claims, 3 Drawing Sheets

FOREIGN PATENT DOCUMENTS

| | | |
|---|---|---|
| JP | 11-220409 | 8/1999 |
| JP | 2000-101456 | 4/2000 |
| JP | 2000101456 A | 4/2000 |
| JP | 2002-043813 | 2/2002 |
| JP | 2003-243998 | 8/2003 |
| KR | 1020020004733 A | 1/2002 |
| KR | 1020020049746 A | 6/2002 |
| WO | WO 00/48312 | 8/2000 |
| WO | WO 00/48312 A | 8/2000 |
| WO | WO 01/28125 A | 4/2001 |
| WO | WO 01/28125 A1 | 4/2001 |

\* cited by examiner

POWER AMPLIFICATION SYSTEM AND METHOD

CROSS-REFERENCE TO RELATED APPLICATIONS

Pursuant to 35 U.S.C. § 119(a), this application claims the benefit of earlier filing date and right of priority to the Korean Application No. 2002-63207, filed on Oct. 16, 2002, the content of which is hereby incorporated by reference herein in its entirety.

BACKGROUND OF THE INVENTION

1. Field of the Invention

The present invention relates to a mobile terminal and, more particularly, to an apparatus and method for controlling power amplification in a mobile terminal.

2. Description of the Background Art

In general, a mobile communication terminal is an equipment by which a user can communicate with another party. Such mobile communication terminals may include but are not limited to cellular telephones, Personal Digital Assistants (PDAs), etc. As the mobile terminal is wirelessly connected to a mobile base station of a pertinent service area, it can maintain a communication state even while moving.

A mobile communication network is wirelessly connected to the mobile terminal through a base station and checks a moving direction of the mobile terminal on a real time basis. The base station keeps checking how far the terminal is, in order to maintain a constant communication sensitivity between itself and the mobile terminal. At the side of the mobile terminal, in order to maintain the constant communication sensitivity, the mobile terminal should maintain a constant power level for a radio frequency signal outputted from an antenna.

Referring to FIG. 1, the output power of the mobile terminal is the power of a radio frequency signal radiated through the antenna of the mobile terminal to the base station. A related apparatus for controlling output power of a mobile terminal includes a radio frequency generating source 6 for generating a radio frequency signal corresponding to a data signal to be transmitted, a power amplifier module (PAM) 5 for amplifying power of a radio frequency signal generated by the radio frequency generating source 6, a coupler 4 for detecting the power amplified by the PAM 5, and an antenna switch 3 for selecting a radio frequency signal (e.g., a TX signal) outputted from the coupler 4 or a reception signal (e.g., an RX signal) received from the antenna 1.

There may also be included a mobile switch 2 for applying the frequency signal selected by the antenna switch 3 to the antenna (ANT) 1, a controller 8 for generating a reference power value for controlling power of the radio frequency signal radiated through the ANT 1, and a comparator 9 for comparing the reference power value generated by the controller 8 and the power value of the radio frequency signal outputted from the coupler 4 and applying a difference value corresponding to the comparison result to the PAM 5. The PAM 5 amplifies power of the radio frequency signal generated by the radio frequency generating source 6.

Accordingly, the radio frequency generating source 6 generates a frequency signal corresponding to a data signal to be transmitted, and applies the generated radio frequency signal to the PAM 5. The PAM 5 amplifies power of the radio frequency signal applied from the radio frequency generating source 6 by a certain amplification factor and outputs the amplified radio frequency signal to the coupler 4. The certain amplification factor is determined by a difference value applied from the comparator 9. This difference value is a rate for amplifying power of the radio frequency signal generated by the radio frequency generating source 6.

The coupler 4 applies the radio frequency signal with the amplifier power received from the PAM 5 to a non-inversion terminal (+) of the comparator and to the antenna switch 3. The antenna switch 3 applies the radio frequency signal received from the coupler 4 to the mobile switch 2 according to a control signal of the controller 8, and applies a reception signal wirelessly received from the antenna to a receiving unit 7.

The mobile switch 2 transfers wirelessly the radio frequency signal outputted from the antenna switch 3 to the base station through the antenna 1. The controller 8 generates a reference power value and applies the reference power value to an inversion terminal (−) of the comparator 9. The reference power value is a value previously set in the controller 8, and the PAM 5 generates power corresponding to the reference power value.

The comparator 9 compares the reference power value applied from the controller 8 and the power value applied from the coupler 4, and applies a difference value corresponding to the comparison result as a power control signal (e.g., an APC) to the PAM 5. For example, the PAM 5 controls an amplification factor of the power of the radio frequency signal generated by the radio frequency generating source 6 on the basis of the difference value so that the power value of the radio frequency signal applied to the coupler 4 can be the same as the reference power value.

Unfortunately, the related apparatus for controlling output power of a mobile terminal has the following problems. A power loss is generated due to supplementary devices attached to the mobile terminal or due to user's contact with the mobile terminal and a user. Also, a power loss generated by the circuits (the mobile switch, the antenna switch, the coupler or the like) of the mobile terminal, and a power loss generated due to a mismatching between the antenna 1 and the mobile switch 2 destabilize the output power of the radio frequency signal radiated from the antenna of the mobile terminal. In addition, because the output power is unstable, the communication sensitivity of the mobile terminal with respect to the mobile communication system is degraded and thus speech quality suffers.

As such, methods and systems are needed to overcome the above-stated problems.

SUMMARY OF THE INVENTION

An apparatus for controlling output power of a mobile terminal, in accordance with one or more embodiments, is provided. The apparatus comprises a power amplifier module for amplifying power of a radio frequency signal, corresponding to a data signal, to a first power level; a transmitter for radiating the radio frequency signal at the first power level to a base station through an antenna of a mobile terminal; and a power compensating unit for measuring the first power level and generating a first difference value by comparing the first power level with a pre-set reference power value. The power amplifier module controls an amplification factor for amplifying the power of the radio frequency signal corresponding to the data signal on the basis of the first difference value.

The transmitter comprises a coupler for detecting the first power level; an antenna switch for selecting the radio frequency signal outputted through the coupler; a mobile switch for applying the radio frequency signal selected by the antenna switch for radio transmission; and an antenna for radiating the radio frequency signal outputted from the mobile switch to the base station.

The power compensating unit comprises a feedback unit for measuring a second power level associated with the output power of the radio frequency signal radiated from the antenna; a controller for generating the pre-set reference power value in order to maintain a constant power level of the radio frequency signal radiated from the antenna; and a comparing unit for comparing the second power level with the reference power value generated by the controller.

In accordance with a certain embodiment, a system for maintaining an amplified transmission level for a mobile communication device is provided. The system comprises an amplification module in communication with a signal generator of the mobile communication device; a communication module for transmitting a first signal amplified by the amplification module in form of a second signal; and a power adjusting unit in communication with the amplification module and the communication module, wherein the power adjusting unit measures first and second power levels respectively associated with the first and second signals to determine first and second difference values, and wherein an amplification factor of the amplification module is adjusted based on the first and second difference values.

The first difference value is used to generate a first auto power control (APC) signal provided to the amplification module for adjusting the amplification factor. The second difference value is used to generate a second auto power control (APC) signal provided to the amplification module for adjusting the amplification factor. The first difference value is determined by comparing the first power level with a predetermined value. The second difference value is determined by comparing the second power level with a predetermined value.

In one embodiment, the communication module further comprises a coupler for measuring the first power level associated with the first signal. The communication module further comprises an antenna from which the second signal is transmitted. The communication module further comprises an antenna switch and a mobile switch for switching the first signal to the antenna. The communication module further comprises a receiving unit for receiving an incoming signal from the antenna.

The power adjusting unit comprises a comparing unit for comparing the first and second power levels with a predetermined value to determine the first and second difference values. The power adjusting unit further comprises a feedback unit for measuring the second power level associated with the second signal. The second signal is the first signal when transmitted by an antenna in communication with the amplification module. The power adjusting unit further comprises a controller for providing the predetermined value.

The power adjusting unit further comprises a controller for providing the predetermined value. The first and second APC signals are provided to the amplification module to control adjustment of the amplification factor. The amplification factor is increased, if at least one of the first and second difference values is below a first threshold. The amplification factor is decreased, if at least one of the first and second difference values is above a first threshold.

In accordance with another embodiment, a method for maintaining an amplified transmission level for a mobile communication device is provided. The method comprises comparing a first power level associated with a first signal generated by an amplification module with a first threshold to determine a first difference value; comparing a second power level associated with second signal generated by an antenna in communication with the amplification module with a second threshold to determine a second difference value; and adjusting an amplification factor of the amplification module based on the first and second difference values.

The method further comprises generating first and second auto power control (APC) signals based on the respective first and second difference values; and providing the first and second APC signals to the amplification module. The amplification factor is adjusted based on the first and second APC signals. That is, the amplification factor is increased if the first difference value indicates that the first power level is less than a predetermined power level. Or, the amplification factor is increased if the second difference value indicates that the second power level is less than a predetermined power level.

In some embodiments, the amplification factor is decreased if the first difference value indicates that the first power level is greater than a predetermined power level. Or, the amplification factor is decreased if the second difference value indicates that the second power greater is less than a predetermined power level.

Features, elements, and aspects of the invention that are referenced by the same numerals in different figures represent the same, equivalent, or similar features, elements, or aspects in accordance with one or more embodiments of the system.

DETAILED DESCRIPTION OF THE PREFERRED EMBODIMENTS

In accordance with one or more embodiments of the invention a method and system for controlling output power of a mobile terminal for improving communication sensitivity and speech quality between the mobile terminal and a mobile communication system is provided. The power of a radio frequency signal radiated from an antenna of the mobile terminal is detected. Then, the output power of the mobile terminal is controlled to be constant and stable based on the detected power value.

Figure 1:
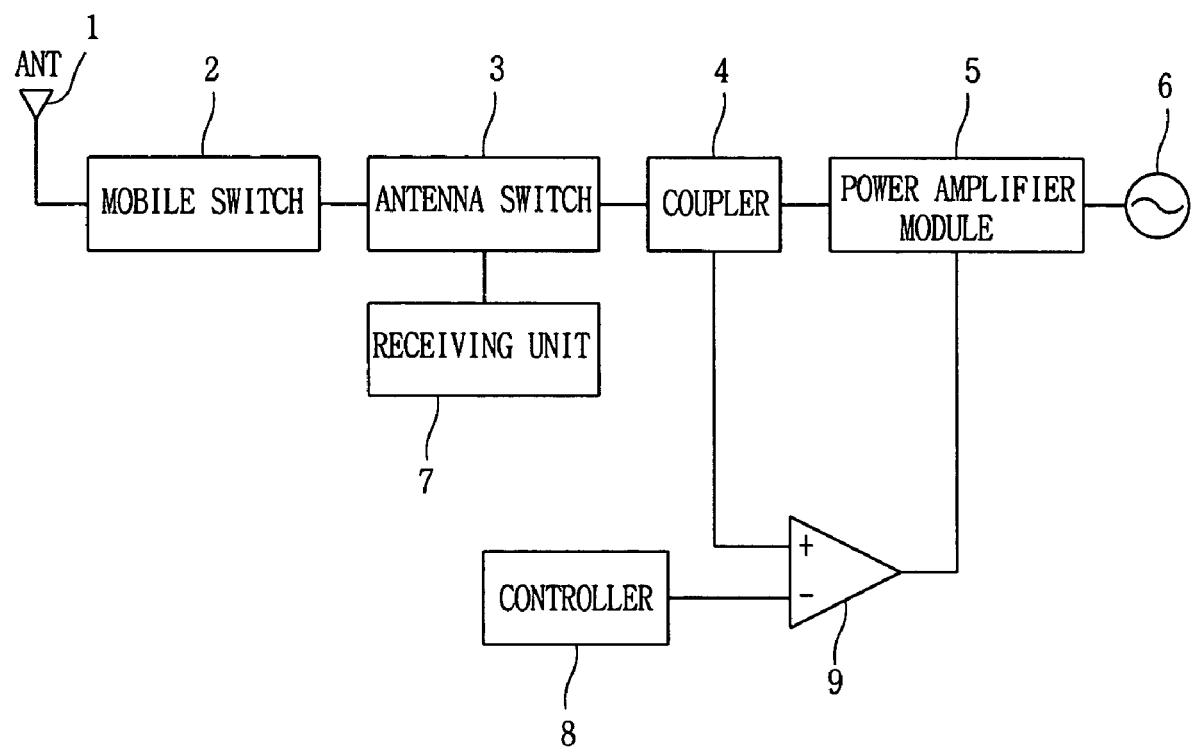
FIG. 1 illustrates an apparatus for controlling output power of a mobile terminal according to the related art.
Figure 2:
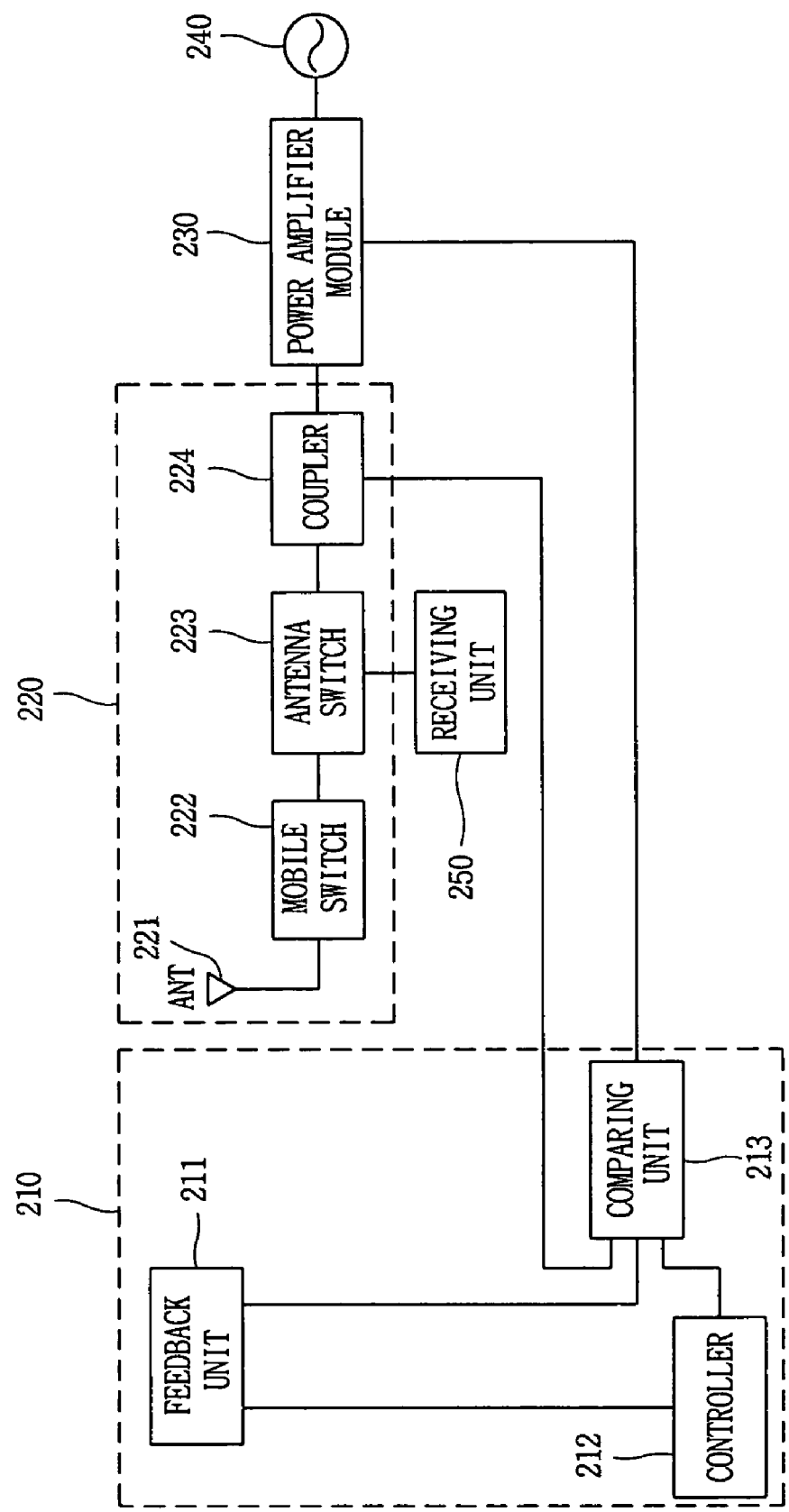
FIG. 2 illustrates an apparatus for controlling output power of a mobile terminal in accordance with one embodiment of the invention.

Referring to FIG. 2, an apparatus for controlling output power of a mobile terminal in accordance with the present invention comprises a radio frequency generating source 240 for generating a radio frequency signal corresponding to a data signal to be transmitted; a power amplifier module 230 for amplifying power of the radio frequency signal generated by the radio frequency generating source 240 to a certain amplification factor; and a transmitter 220 for radiating the radio frequency signal with an amplified power to a base station (not shown).

In certain embodiments, the apparatus further comprises a power compensating unit 210 for detecting power of the radio frequency signal radiated from the antenna 221 and compensating a difference value between the detected power value and a pre-set reference power value. The power amplifier module 230 increases or decreases an amplification factor of the power of the radio frequency signal corresponding to the data signal based on the difference value.

For example, if the power value of the radio frequency signal radiated from the antenna 221 is greater than the pre-set reference power value, the power amplifier module 230 decreases an amplification factor for amplifying power of the radio frequency signal corresponding to the data signal. If the power value of the radio frequency signal radiated from the antenna 221 is smaller than the reference power value, the power amplifier module 230 increases the amplification factor for amplifying the power of the radio frequency signal corresponding to the data signal.

In one or more embodiments, the transmitter 220 comprises a coupler 224 for detecting the power amplified by the power amplifier module 230, and an antenna switch 223 for selecting a radio frequency signal (e.g., a TX signal) outputted through the coupler 224. The antenna switch 223 could also apply a reception signal (e.g., an RX signal) received from the antenna 221 to the receiving unit 250.

The transmitter 220 may also comprise mobile switch 222 for applying the radio frequency signal selected by the antenna switch 223 to the antenna 221 for radio transmission and an antenna (ANT) 221 for radiating the radio frequency signal outputted from the mobile switch 222 to the base station. The power compensating unit 210, in one embodiment may comprise a feedback unit 211 for detecting output power of the radio frequency signal radiated from the antenna 221.

A controller 212 may be also included for generating a pre-set reference power value in order to maintain a constant power level for the radio frequency signal radiated from the antenna 221. A comparing unit 213 may be also included for comparing the power value detected by the feedback unit 211 with the reference power value generated by the controller 212. The comparing unit 213 generates a difference value (corresponding to the comparison result) in form of an auto power control (APC) signal, and outputs the generated APC signal to the power amplifier module 230.

The power amplifier module 230 controls an amplification factor for amplifying the power of the radio frequency signal outputted from the radio frequency generating source 240 on the basis of the APC signal, to thereby increase or decrease power of the radio frequency signal applied to the coupler 224.

Figure 3:
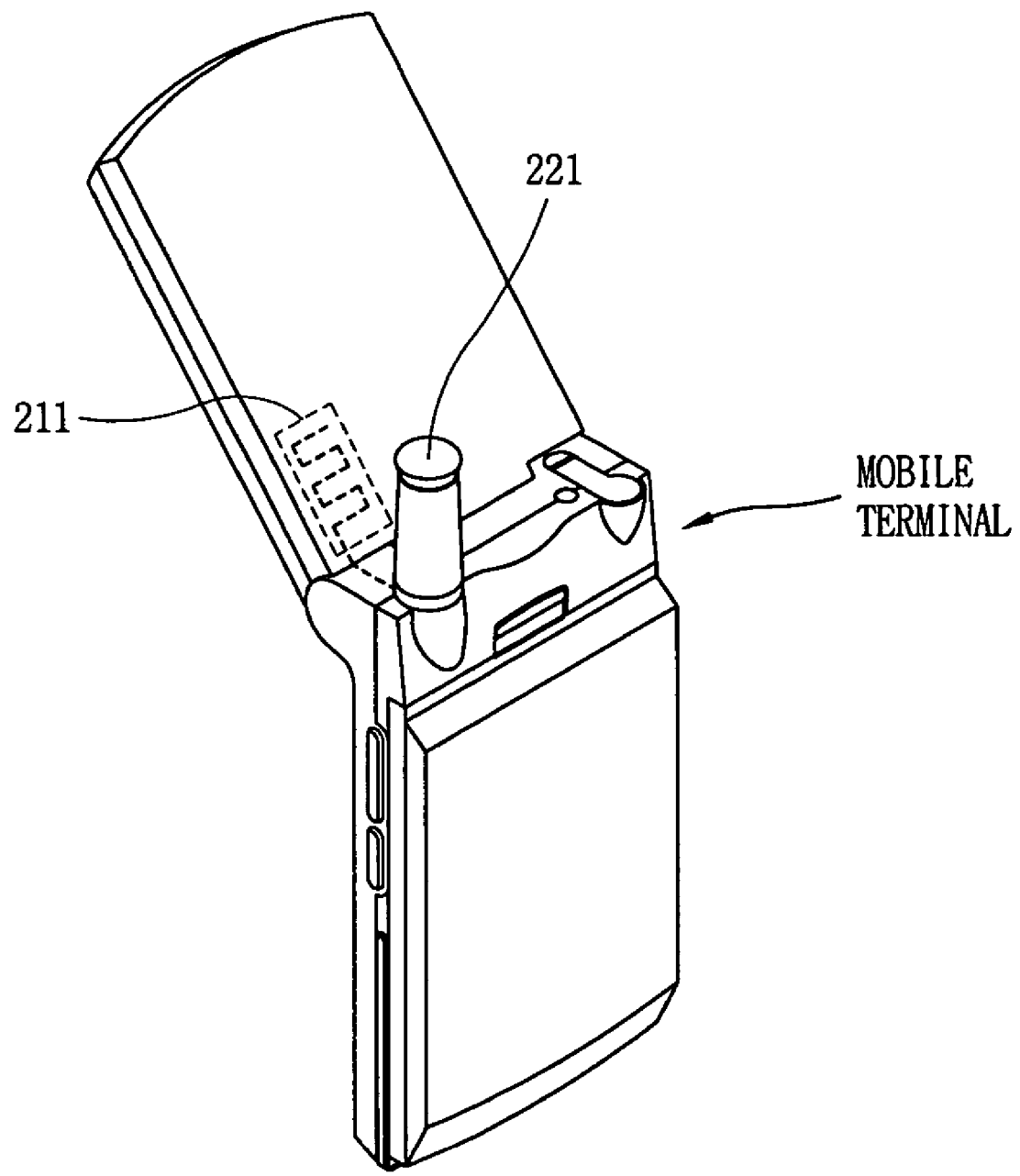
FIG. 3 illustrates a preferred embodiment having a feedback unit integrally formed at a portion adjacent to the antenna of the mobile terminal.

Referring to FIG. 3, preferably, the feedback unit 211 is integrally formed at a portion adjacent to the antenna 221 of the mobile terminal. The radio frequency generating source 240 generates a radio frequency signal corresponding to a data signal (e.g., a voice signal) to be transmitted, and outputs the radio frequency signal to the power amplifier module 230.

The power amplifier module 230, thus in one embodiment, amplifies the power of the radio frequency signal outputted from the radio frequency generating resource 240 to a certain amplification factor. The power amplifier module 230 then outputs the radio frequency signal with the amplified power to the coupler 224. If the radio frequency signal power value detected by the coupler 224 is greater than the pre-set reference power value, the certain amplification factor is decreased. If, however, the radio frequency signal power value detected by the coupler 224 is smaller than the reference power value, the certain amplification factor is increased.

In some embodiments, the coupler 224 detects the power of the radio frequency signal outputted from the power amplifier module 230, and applies a value of the detected power to the comparing unit 213 according to a control signal of the controller 212. The coupler 224 may convert the detected power into a voltage and output the converted voltage to the comparing unit 213.

The controller 212 generates a reference power value and applies this value to the comparing unit 213. In one embodiment, the controller 212 may output a reference voltage value corresponding to the reference power value to the comparing unit 213. The reference power value can be set in the controller 212 in order to generate a regular power from the power amplifier module 230 of the mobile terminal.

The pre-set reference power value is, for example, a value to control the power amplification factor of the power amplifier module 230 so that the value of power generated from the power amplifier module 230 can be the same as the value of the output power of the radio frequency signal radiated from the antenna 221.

The comparing unit 213, preferably, compares the power value detected by the coupler 224 and the reference power value outputted from the controller 212, and outputs a difference value (i.e., the comparison result) as a first APC signal to the power amplifier module 230.

For example, if the power value detected by the coupler 224 is greater than the reference power value outputted from the controller 212, the comparing unit 213 outputs an APC signal for reducing the power amplification factor of the power amplifier module 230. If the power value detected by the coupler 224 is smaller than the reference power value outputted from the controller 212, the comparing unit 213 outputs an APC signal for increasing the power amplification factor of the power amplifier module 230.

The power amplifier module 230 controls the amplification factor for amplifying power of the radio frequency signal outputted form the radio frequency generating source 240 based on the first APC signal, so that the power value outputted from the radio frequency generating source 240 can be the same as the reference power value.

Accordingly, the power amplifier module 230 can output a radio frequency signal with power corresponding to the reference power value to the coupler 224. The coupler 224 applies the radio frequency signal outputted from the power amplifier module 230 to the antenna switch 223. The power value of the radio frequency signal applied to the coupler 224 is the same as the pre-set reference power value.

The antenna switch 223 applies the radio frequency signal inputted through the coupler 224 to the antenna 221 through the mobile switch 222 according to a control signal of the controller 212. In addition, the antenna switch 223 outputs a reception signal received from the antenna 221 through the mobile switch 222 to the receiving unit 250. The receiving unit 250 is a device for processing a signal received from the base station.

In some embodiments, the radio frequency signal with the amplifier power outputted from the antenna 221 is radiated to the base station. Thereafter, the feedback unit 211 detects power of the radio frequency signal radiated from the antenna 221 according to a control signal of the controller 212, and applies the detected power value to the comparing unit 213. The feedback unit 211 may convert the detected power to a voltage and output the voltage to the comparing unit 213, for example.

The comparing unit 213 compares the power value applied from the feedback unit 211 and a reference power value generated by the controller 212, and outputs a difference value corresponding to the comparison result as a second APC signal to the power amplifier module 230. If the power value applied from the feedback unit 211 is the same as the reference power value, the comparing unit 213 does not generate a second APC signal.

If the power of the radio frequency signal outputted from the power amplifier module 230 is lost due to user's contact with the mobile terminal or by a supplementary device attached to the mobile phone, or by a mismatching of the antenna, the lost power is compensated so that the power of the radio frequency signal outputted from the power amplifier module 230 can be radiated with a constant level to the base station through the antenna 221.

In some embodiments, the power amplification factor of the power amplifier module is controlled based on the second APC signal so that the power value of the radio frequency signal radiated from the antenna can be the same as the reference power value.

For example, if the power value of the radio frequency signal radiated from the antenna 221 is greater than the reference power value, the power amplifier module 230 reduces the power amplification factor so that the power value of the radio frequency signal radiated from the antenna 221 can be the same as the reference power value. If the power value of the radio frequency signal radiated from the antenna 221 is smaller than the reference power value, the power amplifier module 230 increases the power amplification factor.

Accordingly, the present invention compensates the power lost in the mobile terminal, by controlling the power level of the radio frequency signal outputted from the antenna 221 of the mobile terminal to be maintained at a constant level. In addition, the power level of the radio frequency signal radiated from the antenna 221 of the mobile terminal is accurately and precisely adjusted with the pre-set reference power value to maintain a constant communication sensitivity of the mobile terminal.

Accordingly, a speech quality of the mobile terminal can be improved by adjusting the amplification power. Advantageously, power of the radio frequency signal radiated from the antenna of the mobile terminal is detected and power of the radio frequency signal radiated from the antenna is controlled to be constant and stable based on the detected power value. Therefore, regardless of the power loss generated because of user's contact or the power loss generated due to a mismatching between the antenna (ANT) and the mobile switch of the mobile terminal, the communication sensitivity of the mobile terminal can be maintained at a constant level.

In addition, when the communication sensitivity of the mobile terminal is maintained, the power of the radio frequency signal radiated from the antenna of the mobile terminal is stabilized. As a result, the speech quality of the mobile terminal is also enhanced.

The embodiments described above are to be considered in all aspects as illustrative only and not restrictive in any manner. Thus, other exemplary embodiments, system architectures, platforms, and implementations that can support various aspects of the invention may be utilized without departing from the essential characteristics described herein. These and various other adaptations and combinations of features of the embodiments disclosed are within the scope of the invention. The invention is defined by the claims and their full scope of equivalents.

What is claimed is:

1. An apparatus for controlling output power of a mobile terminal comprising:
   a power amplifier module for amplifying power of a radio frequency signal, corresponding to a data signal, to a first power level;
   a transmitter for radiating the radio frequency signal at the first power level to a base station through an antenna of a mobile terminal; and
   a power compensating unit for measuring the first power level and generating a first difference value by comparing the first power level with a pre-set reference power value,
   wherein the power amplifier module controls an amplification factor for amplifying the power of the radio frequency signal corresponding to the data signal on the basis of the first difference value, and
   wherein the power compensating unit comprises:
   a feedback unit for measuring a second power level associated with the output power of the radio frequency signal radiated from the antenna;
   a controller for generating the pre-set reference power value in order to maintain a constant power level of the radio frequency signal radiated from the antenna; and
   a comparing unit for comparing the second power level with the reference power value generated by the controller.

2. The apparatus of claim 1, wherein the transmitter comprises:
   a coupler for detecting the first power level;
   an antenna switch for selecting the radio frequency signal outputted through the coupler;
   a mobile switch for applying the radio frequency signal selected by the antenna switch for radio transmission; and
   an antenna for radiating the radio frequency signal outputted from the mobile switch to the base station.

3. A system for maintaining an amplified transmission level for a mobile communication device, the system comprising:
   an amplification module in communication with a signal generator of the mobile communication device;
   a communication module for transmitting a first signal amplified by the amplification module in form of a second signal; and
   a power adjusting unit in communication with the amplification module and the communication module, wherein the power adjusting unit measures first and second power levels respectively associated with the first and second signals to determine first and second difference values, and wherein an amplification factor of the amplification module is adjusted based on the first and second difference values.

4. The system of claim 3, wherein the first difference value is used to generate a first auto power control (APC) signal provided to the amplification module for adjusting the amplification factor.

5. The system of claim 4, wherein the second difference value is used to generate a second auto power control (APC) signal provided to the amplification module for adjusting the amplification factor.

6. The system of claim 5, wherein the first and second APC signals are provided to the amplification module to control adjustment of the amplification factor.

7. The system of claim 3, wherein the first difference value is determined by comparing the first power level with a predetermined value.

8. The system of claim 7, wherein the power adjusting unit further comprises a controller for providing the predetermined value.

9. The system of claim 3, wherein the second difference value is determined by comparing the second power level with a predetermined value.

10. The system of claim 9, wherein the power adjusting unit further comprises a controller for providing the predetermined value.

11. The system of claim 3, wherein the communication module further comprises:
a coupler for measuring the first power level associated with the first signal.

12. The system of claim 11, wherein the communication module further comprises an antenna from which the second signal is transmitted.

13. The system of claim 12, wherein the communication module further comprises:
an antenna switch and a mobile switch for switching the first signal to the antenna.

14. The system of claim 13, wherein the communication module further comprises a receiving unit for receiving an incoming signal from the antenna.

15. The system of claim 3, wherein the power adjusting unit comprises a comparing unit for comparing the first and second power levels with a predetermined value to determine the first and second difference values.

16. The system of claim 15, wherein the second signal is the first signal when transmitted by an antenna in communication with the amplification module.

17. The system of claim 3, wherein the power adjusting unit further comprises a feedback unit for measuring the second power level associated with the second signal.

18. The system of claim 3, wherein the amplification factor is increased, if at least one of the first and second difference values is below a first threshold.

19. The system of claim 3, wherein the amplification factor is decreased, if at least one of the first and second difference values is above a first threshold.

20. A method for maintaining an amplified transmission level for a mobile communication device, the method comprising:
comparing a first power level associated with a first signal generated by an amplification module with a first threshold to determine a first difference value;
comparing a second power level associated with second signal generated by an antenna in communication with the amplification module with a second threshold to determine a second difference value; and
adjusting an amplification factor of the amplification module based on the first and second difference values.

21. The method of claim 20 further comprising:
generating first and second auto power control (APC) signals based on the respective first and second difference values; and
providing the first and second APC signals to the amplification module.

22. The method of claim 21, wherein the amplification factor is adjusted based on the first and second APC signals.

23. The method of claim 20, wherein the amplification factor is increased if the first difference value indicates that the first power level is less than a predetermined power level.

24. The method of claim 20, wherein the amplification factor is increased if the second difference value indicates that the second power level is less than a predetermined power level.

25. The method of claim 20, wherein the mobile communication device comprises:
an amplification module in communication with a signal generator of the mobile communication device;
a communication module for transmitting the first signal amplified by the amplification module in form of the second signal; and
a power adjusting unit in communication with the amplification module and the communication module, wherein the power adjusting unit measures the first and second power levels respectively associated with the first and second signals to determine the first and second difference values.

26. The method of claim 25, wherein the first difference value is used to generate a first auto power control (APC) signal provided to the amplification module for adjusting the amplification factor.

27. The method of claim 26, wherein the second difference value is used to generate a second auto power control (APC) signal provided to the amplification module for adjusting the amplification factor.

28. The method of claim 25, wherein the communication module further comprises:
a coupler for measuring the first power level associated with the first signal.

29. The method of claim 28, wherein the communication module further comprises an antenna switch and a mobile switch for switching the first signal to the antenna.

30. The method of claim 20, wherein the amplification factor is decreased if the first difference value indicates that the first power level is greater than a predetermined power level.

31. The method of claim 20, wherein the amplification factor is decreased if the second difference value indicates that the second power greater is less than a predetermined power level.

* * * * *